United States Patent
Wang et al.

(10) Patent No.: US 10,141,451 B2
(45) Date of Patent: Nov. 27, 2018

(54) ELECTRODE LAYER, THIN FILM TRANSISTOR, ARRAY SUBSTRATE AND DISPLAY APPARATUS HAVING THE SAME, AND FABRICATING METHOD THEREOF

(71) Applicant: BOE TECHNOLOGY GROUP CO., LTD., Beijing (CN)

(72) Inventors: Meili Wang, Beijing (CN); Liangchen Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/501,854

(22) PCT Filed: Jun. 7, 2016

(86) PCT No.: PCT/CN2016/085093
§ 371 (c)(1),
(2) Date: Feb. 5, 2017

(87) PCT Pub. No.: WO2017/024882
PCT Pub. Date: Feb. 16, 2017

(65) Prior Publication Data
US 2017/0236940 A1    Aug. 17, 2017

(30) Foreign Application Priority Data
Aug. 13, 2015    (CN) .......................... 2015 1 0497884

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 27/1288* (2013.01);
(Continued)

(58) Field of Classification Search
CPC ......... H01L 21/02436; H01L 21/02496; H01L 21/02518; H01L 21/702
See application file for complete search history.

(56) References Cited

U.S. PATENT DOCUMENTS

2006/0108587 A1    5/2006 Lee et al.
2010/0117091 A1    5/2010 Kaitoh et al.
(Continued)

FOREIGN PATENT DOCUMENTS

CN    1808710 A    7/2006
CN    101719514 A    6/2010
(Continued)

OTHER PUBLICATIONS

International Search Report & Written Opinion dated Sep. 13. 2016 regarding PCT/CN2016/085093.
(Continued)

*Primary Examiner* — Cheung Lee
(74) *Attorney, Agent, or Firm* — Intellectual Valley Law, P.C.

(57) ABSTRACT

The present application discloses a thin film transistor including an active layer, and a source electrode and a drain electrode on the active layer; each of the source electrode and the drain electrode includes a metal electrode sub-layer, and a diffusion barrier sub-layer made of a material comprising $M1O_aN_b$, wherein M1 is a single metal or a combination of metals, $a \geq 0$, and $b > 0$, between the metal electrode sub-layer and the active layer for preventing diffusion of metal electrode material into the active layer.

20 Claims, 3 Drawing Sheets

(51) Int. Cl.
*H01L 29/423* (2006.01)
*H01L 29/45* (2006.01)
*H01L 29/66* (2006.01)
*H01L 29/417* (2006.01)

(52) U.S. Cl.
CPC .. *H01L 29/41733* (2013.01); *H01L 29/42356* (2013.01); *H01L 29/45* (2013.01); *H01L 29/66969* (2013.01); *H01L 29/78618* (2013.01)

(56) References Cited

U.S. PATENT DOCUMENTS

| | | |
|---|---|---|
| 2011/0227060 A1 | 9/2011 | Miyanaga et al. |
| 2012/0080753 A1* | 4/2012 | Singh .................. B82Y 30/00 257/347 |
| 2013/0299827 A1 | 11/2013 | Yamazaki et al. |

FOREIGN PATENT DOCUMENTS

| | | |
|---|---|---|
| CN | 102549758 A | 7/2012 |
| CN | 102832253 A | 12/2012 |
| CN | 104659106 A | 5/2015 |
| JP | 2010028021 A | 2/2010 |
| TW | 201515232 A | 4/2015 |

OTHER PUBLICATIONS

First Office Action in the Chinese Patent Application No. 201510497884.0, dated Aug. 11, 2017; English translation attached.
Second Office Action in the Chinese Patent Application No. 201510497884.0, dated Feb. 14, 2018; English translation attached.

* cited by examiner

ELECTRODE LAYER, THIN FILM TRANSISTOR, ARRAY SUBSTRATE AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/085093, filed Jun. 7, 2016, which claims priority to Chinese Patent Application No. 201510497884.0, filed Aug. 13, 2015, the contents of which are incorporated by reference in the entirety.

TECHNICAL FIELD

The present invention relates to display technology, more particularly, to an electrode layer, a thin film transistor, an array substrate and a display apparatus having the same, and a fabricating method thereof.

BACKGROUND

Having the advantage of being ultrathin and having low power consumption, light weight, and high display quality, liquid crystal display and organic light emitting display have found a wide range of applications in display field. The pixels in liquid crystal display and organic light emitting display are driven by thin film transistors. The thin film transistors include a source electrode, a drain electrode, and a gate electrode. Resistivity of the source electrode and the drain electrode affects transmission rate of display signals and display quality.

Typically, the source electrode and the drain electrode of a thin film transistor are made of aluminum having relatively large resistivity, leading to a relatively slow transmission rate of display signals and poor display quality. To improve display quality, a conventional display apparatus includes driving circuits on both sides of the thin film transistor, resulting in relatively high manufacturing costs.

SUMMARY

In one aspect, the present invention provides a thin film transistor comprising an active layer, and a source electrode and a drain electrode on the active layer; wherein each of the source electrode and the drain electrode comprises a metal electrode sub-layer, and a diffusion barrier sub-layer made of a material comprising $M1O_aN_b$, wherein M1 is a single metal or a combination of metals, $a≥0$, and $b>0$, between the metal electrode sub-layer and the active layer for preventing diffusion of metal electrode material into the active layer.

Optionally, the metal electrode sub-layer is made of a material comprising copper or copper alloy.

Optionally, each of the source electrode and the drain electrode further comprises an etch stop sub-layer made of a material comprising $M2O_cN_d$, wherein M2 is a single metal or a combination of metals, $c≥0$, and $d>0$ on a side of the metal electrode sub-layer distal to the diffusion barrier sub-layer.

Optionally, the diffusion barrier sub-layer made of a material comprising zinc oxynitride, and the etch stop sub-layer made of a material comprising zinc oxynitride.

Optionally, at least one of the diffusion barrier sub-layer and the etch stop sub-layer is made of a material comprising zinc oxynitride doped with one or more metal element.

Optionally, the one or more metal element is selected from one or a combination of zinc, indium, gallium, tin, hafnium, aluminum, titanium, manganese, molybdenum, tungsten, and magnesium.

Optionally, at least one of the diffusion barrier sub-layer and the etch stop sub-layer is made of a material comprising zinc oxynitride doped with one or more non-metal element.

Optionally, the one or more metal element is selected from one or a combination of sulfur, fluorine, chlorine, and carbon.

Optionally, each of the diffusion barrier sub-layer and the etch stop sub-layer has a thickness in the range of about 2 nm to about 100 nm.

Optionally, a wet etch selectivity between the diffusion barrier sub-layer and the metal electrode sub-layer is in the range of about 5:1 to about 100:1.

Optionally, the active layer is an oxide active layer.

Optionally, the thin film transistor further comprises a gate electrode, a gate insulating layer on the gate electrode, wherein the active layer is on a side of the gate insulating layer distal to the gate electrode, the diffusion barrier sub-layer is on a side of the active layer distal to the gate insulating layer.

Optionally, the thin film transistor further comprises a gate insulating layer on a side of the etch stop sub-layer distal to the metal electrode sub-layer, and a gate electrode on a side of the gate insulating layer distal to the etch stop sub-layer.

In another aspect, the present invention provides a method of fabricating a thin film transistor, the method comprising forming an active layer; and forming a source electrode and a drain electrode on the active layer, wherein the step of forming each of the source electrode and the drain electrode comprises forming a diffusion barrier sub-layer made of a material comprising $M1O_aN_b$, wherein M1 is a single metal or a combination of metals, $a≥0$, and $b>0$ on the active layer; and forming a metal electrode sub-layer on a side of the diffusion barrier sub-layer distal to the active layer.

Optionally, the metal electrode sub-layer is made of a material comprising copper or copper alloy.

Optionally, the step of forming each of the source electrode and the drain electrode further comprises forming an etch stop sub-layer made of a material comprising $M2O_cN_d$, wherein M2 is a single metal or a combination of metals, $c≥0$, and $d>0$ on a side of the metal electrode sub-layer distal to the diffusion barrier sub-layer.

Optionally, the diffusion barrier sub-layer made of a material comprising zinc oxynitride, and the etch stop sub-layer made of a material comprising zinc oxynitride.

Optionally, the method further comprises forming a gate electrode, forming a gate insulating layer on the gate electrode, wherein the active layer is formed on a side of the gate insulating layer distal to the gate electrode, the diffusion barrier sub-layer is formed on a side of the active layer distal to the gate insulating layer.

Optionally, the method further comprises forming a gate insulating layer on a side of the etch stop sub-layer distal to the metal electrode sub-layer, and forming a gate electrode on a side of the gate insulating layer distal to the etch stop sub-layer.

Optionally, the active layer, the source electrode, and the drain electrode are patterned in a single patterning process using a single half-tone mask.

In another aspect, the present invention provides an electrode layer in a semiconductor apparatus comprising a metal electrode sub-layer, and a diffusion barrier sub-layer made of a material comprising $M2O_cN_d$, wherein M2 is a single metal or a combination of metals, c≥0, and d>0 on a side of the metal electrode sub-layer for preventing diffusion of metal electrode material.

Optionally, the metal electrode sub-layer is made of a material comprising copper or copper alloy.

Optionally, the electrode layer further comprises an etch stop sub-layer made of a material comprising $M2O_cN_d$, wherein M2 is a single metal or a combination of metals, c≥0, and d>0 on a side of the metal electrode sub-layer distal to the diffusion barrier sub-layer.

Optionally, the diffusion barrier sub-layer made of a material comprising zinc oxynitride, and the etch stop sub-layer made of a material comprising zinc oxynitride.

In another aspect, the present invention provides an array substrate comprising the thin film transistor described herein or fabricated by a method described herein.

In another aspect, the present invention provides a display apparatus comprising an array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
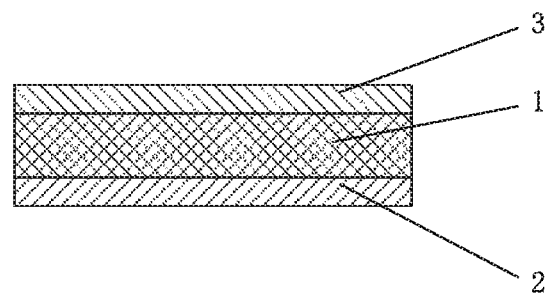
FIG. 1 is a diagram illustrating the structure of an electrode layer in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides a novel electrode layer, a novel thin film transistor, an array substrate and a display apparatus having the same, and a fabricating method thereof. In one aspect, the present disclosure provides an electrode layer in a semiconductor apparatus having at least two sub-layers, one of which is a metal electrode sub-layer such as a copper or copper alloy electrode sub-layer. The other sub-layers of the present electrode layer are coatings disposed on one or both sides of the metal electrode sub-layer. For example, the electrode layer may include a diffusion barrier sub-layer made of a material including metal oxynitride or metal nitride on a side of the metal electrode sub-layer for preventing diffusion of metal electrode material. In some embodiments, the electrode layer further includes an etch stop sub-layer made of a material including metal oxynitride or metal nitride on a side of the metal electrode sub-layer distal to the diffusion barrier sub-layer. By having this electrode structure, the electronic properties of the semiconductor apparatus (e.g., a display apparatus, a thin film transistor, or an array substrate) may be improved. Examples of appropriate electrodes suitable for adopting the present electrode structure include, but are not limited to, a source electrode and a drain electrode in a thin film transistor.

In some embodiments, the metal electrode sub-layer is made of a single metal or a combination of metals (e.g., as metal alloys or laminates). Optionally, the metal electrode sub-layer includes one or more of copper, gold, silver, titanium, chromium, aluminum, or a combination thereof (e.g., as metal alloys or laminates).

In some embodiments, the diffusion barrier sub-layer is made of a material including $M1O_aN_b$, wherein M1 is a single metal or a combination of metals (e.g., as metal alloys or laminates), N stands for nitrogen element, O stands for oxygen element, a≥0, and b>0. In some embodiments, the etch stop sub-layer is made of a material including $M2O_cN_d$, wherein M2 is a single metal or a combination of metals (e.g., as metal alloys or laminates), N stands for nitrogen element, O stands for oxygen element, c≥0, and d>0. M2 may be the same as or different from M1, or may have at least one element in common with M1. Optionally, M1 and M2 are different from each other. Optionally, M1 and M2 are different from the material for making the electrode sub-layer (e.g., copper or copper alloy). Optionally, the diffusion barrier sub-layer and the etch stop sub-layer do not include copper, i.e., the single metal or the combination of metals in the diffusion barrier sub-layer and the etch stop sub-layer are different from copper.

Optionally, $M1O_aN_b$ is selected from the group consisting of $ZnO_xN_y$, $ZnN_y$, $AlO_xN_y$, $AlN_y$, $CrO_xN_y$, $CrN_y$, $MoO_xN_y$, $MoN_y$, $TiO_xN_y$, $TiN_y$, $Al_xNd_yO_zN_w$, $Al_xNd_yN_w$, $Mo_xTa_yO_zN_w$, $Mo_xTa_yN_w$, $Mo_xNb_yN_w$, and $Mo_xNb_yO_zN_w$. Optionally, $M2O_aN_b$ is selected from the group consisting of $ZnO_xN_y$, $ZnN_y$, $AlO_xN_y$, $AlN_y$, $CrO_xN_y$, $CrN_y$, $MoO_xN_y$, $MoN_y$, $TiO_xN_y$, $TiN_y$, $Al_xNd_yO_zN_w$, $Al_xNd_yN_w$, $Mo_xTa_yO_zN_w$, $Mo_xTa_yN_w$, $Mo_xNb_yN_w$, and $Mo_xNb_yO_zN_w$. Optionally, $M1O_aN_b$ and $M2O_cN_d$ are $ZnO_xN_y$.

In some embodiments, the diffusion barrier sub-layer is made of $M1O_aN_b$ doped with one or more metal element. In some embodiments, the etch stop sub-layer is made of $M2O_cN_d$ doped with one or more metal element. Optionally, both of the diffusion barrier sub-layer and the etch stop sub-layer are doped with one or more metal element. Optionally, the one or more metal element is selected from one or a combination of zinc, indium, gallium, tin, hafnium, aluminum, titanium, manganese, molybdenum, tungsten, and magnesium.

In some embodiments, the diffusion barrier sub-layer is made of $M1O_aN_b$ doped with one or more non-metal element. In some embodiments, the etch stop sub-layer is made of $M2O_cN_d$ doped with one or more non-metal element. Optionally, both of the diffusion barrier sub-layer and the etch stop sub-layer are doped with one or more non-metal element. Optionally, the one or more non-metal element is selected from one or a combination of sulfur, fluorine, chlorine, and carbon.

In some embodiments, the diffusion barrier sub-layer is made of $M1O_aN_b$ doped with one or more metal element and one or more non-metal element. In some embodiments, the etch stop sub-layer is made of $M2O_aN_b$ doped with one or more metal element and one or more non-metal element. Optionally, both of the diffusion barrier sub-layer and the etch stop sub-layer are doped with one or more metal element and one or more non-metal element. Optionally, the one or more metal element is selected from one or a combination of zinc, indium, gallium, tin, hafnium, aluminum, titanium, manganese, molybdenum, tungsten, and magnesium. Optionally, the one or more non-metal element is selected from one or a combination of sulfur, fluorine, chlorine, and carbon.

By doping the diffusion barrier sub-layer or the etch stop sub-layer with one or more metal element or one or more non-metal element, its ability to prevent copper diffusion, resistance to dry etching, and its wet-etching rate may be further improved. Various metal or non-metal dopants may be screened and selected for improving these characteristics.

Optionally, the diffusion barrier sub-layer or the etch stop sub-layer is un-doped.

FIG. 1 is a diagram illustrating the structure of an electrode layer in some embodiments. Referring to FIG. 1, the electrode layer in the embodiment includes a metal electrode sub-layer 1 made of a material including a single metal or a combination of metals (e.g., copper or copper alloy), and a diffusion barrier sub-layer 2 made of a material including $M1O_aN_b$ (e.g., zinc oxynitride) on a side of the metal electrode sub-layer 1 for preventing diffusion of metal electrode material. The electrode layer may further include an etch stop sub-layer 3 made of a material including $M2O_cN_d$ (e.g., zinc oxynitride) on a side of the metal electrode sub-layer distal to the diffusion barrier sub-layer.

Figure 2:
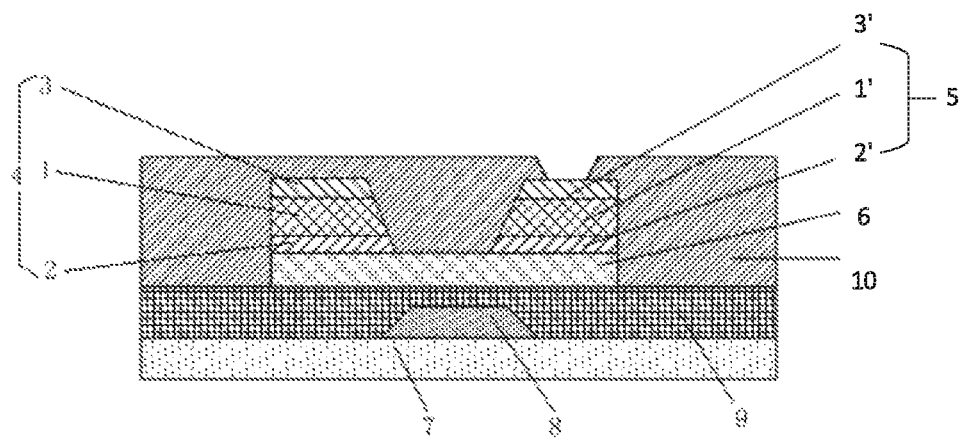
FIG. 2 is a diagram illustrating the structure of a bottom gate thin film transistor in some embodiments.

FIG. 2 is a diagram illustrating the structure of a bottom gate thin film transistor in some embodiments. Referring to FIG. 2, the thin film transistor in the embodiment includes an active layer 6, and a source electrode 4 and a drain electrode 5 on the active layer 4. Each of the source electrode 4 and the drain electrode 5 may have an electrode structure of FIG. 1. In some embodiments, each of the source electrode 4 and the drain electrode 5 includes a metal electrode sub-layer 1 made of a material including a single metal or a combination of metals (e.g., copper or copper alloy), and a diffusion barrier sub-layer 2 made of a material including $M1O_aN_b$ (e.g., zinc oxynitride) between the metal electrode sub-layer 1 and the active layer 4 for preventing diffusion of metal electrode material. Optionally, each of the source electrode 4 and the drain electrode 5 further includes an etch stop sub-layer 3 made of a material including $M2O_cN_d$ (e.g., zinc oxynitride) on a side of the metal electrode sub-layer 1 distal to the diffusion barrier sub-layer 2.

In some embodiments, the diffusion barrier sub-layer 2 completely isolates the metal electrode sub-layer 1 from the active layer 6 so that the metal electrode sub-layer 1 is not in contact with the active layer 6. For example, the projection of the diffusion barrier sub-layer 2 on a base substrate (in plan view of the base substrate) completely covers the projection of the metal electrode sub-layer 1. Optionally, the projection of the diffusion barrier sub-layer 2 on a base substrate is at least substantially co-extensive with that of the metal electrode sub-layer 1. Optionally, the projection of the etch stop sub-layer 3 is substantially co-extensive with that of the metal electrode sub-layer 1.

A source electrode 4 and a drain electrode 5 having a metal electrode sub-layer 1 made of a material including a single metal or a combination of metals (e.g., copper or copper alloy) have low resistivity, leading to a relatively fast and stable transmission rate of display signals. Higher display quality and lower manufacturing costs may be achieved in a display apparatus having such a source electrode 4 and a drain electrode 5, obviating the need for having driving circuits on both sides of the thin film transistor. By having a diffusion barrier sub-layer 2 made of a material including $M1O_aN_b$ (e.g., zinc oxynitride) between the metal electrode sub-layer 1 and the active layer 4, diffusion of copper electrode material into the active layer 6 may be prevented. Because a diffusion barrier sub-layer 2 made of a material including $M1O_aN_b$ (e.g., zinc oxynitride) has a faster etching rate (e.g., wet etching rate) as compared to the copper electrode material, over-etching and damages to the active layer 6 can be avoided during patterning of the source electrode 4 and the drain electrode 5. Moreover, $M2O_cN_d$ (e.g., zinc oxynitride) is resistant to dry etching. By having an etch stop sub-layer 3 made of a material including $M2O_cN_d$ (e.g., zinc oxynitride) on the source electrode 4 and the drain electrode 5, a single etching process may be used to form (1) a via in an area corresponding to the drain electrode extending through only the passivation layer 10 (stop by the etch stop sub-layer 3); and (2) a via in a bonding pad area extending through the passivation layer 10 and the gate insulating layer 9, resulting in a simplified fabricating process and lower manufacturing costs.

In some embodiments, $M1O_aN_b$ or $M2O_cN_d$ is zinc oxynitride. Zinc oxynitride may be represented by a formula $ZnO_aN_b$, wherein a>0, and b>0. Optionally, zinc oxynitride for making the diffusion barrier sub-layer 2 and the etch stop sub-layer 3 may have different Zn:O:N molar ratios. Optionally, zinc oxynitride for making the diffusion barrier sub-layer 2 and the etch stop sub-layer 3 may have a same Zn:O:N molar ratio. Zinc oxynitride material has an exceptional ability to prevent diffusion of copper into the active layer 6 or other semiconductor or electrode layers in the thin film transistor. It also has a fast wet-etching rate and at the same time is resistant to dry etching. Etch selectivity between the diffusion barrier sub-layer 2 and the metal electrode sub-layer 1 (in a wet-etching process) depends in part on the molar ratio of zinc element in the zinc oxynitride material. Thus, by adjusting the zinc molar ratio, the etch selectivity between the diffusion barrier sub-layer 2 and the metal electrode sub-layer 1 (e.g., a copper or copper alloy sub-layer) may be adjusted. Optionally, the etch selectivity (e.g., a wet etch selectivity) between the diffusion barrier sub-layer 2 and the metal electrode sub-layer 1 is in the range of about 5:1 to about 100:1.

In some embodiments, $M1O_aN_b$ or $M2O_cN_d$ (e.g., zinc oxynitride) is doped with one or more metal element. For example, one or both of the diffusion barrier sub-layer 2 and the etch stop sub-layer 3 may be made of a material including $M1O_aN_b$ or $M2O_cN_d$ (e.g., zinc oxynitride) doped with one or more metal element. Optionally, the one or more metal element is selected from one or a combination of zinc, indium, gallium, tin, hafnium, aluminum, titanium, manganese, molybdenum, tungsten, and magnesium.

In some embodiments, $M1O_aN_b$ or $M2O_cN_d$ (e.g., zinc oxynitride) is doped with one or more non-metal element. For example, one or both of the diffusion barrier sub-layer 2 and the etch stop sub-layer 3 may be made of a material including $M1O_aN_b$ or $M2O_cN_d$ (e.g., zinc oxynitride) doped with one or more non-metal element. Optionally, the one or more non-metal element is selected from one or a combination of sulfur, fluorine, chlorine, and carbon.

In some embodiments, $M1O_aN_b$ or $M2O_cN_d$ (e.g., zinc oxynitride) is doped with one or more metal element and one or more non-metal element. For example, one or both of the diffusion barrier sub-layer 2 and the etch stop sub-layer 3 may be made of a material including $M1O_aN_b$ or $M2O_cN_d$ (e.g., zinc oxynitride) doped with one or more metal element and one or more non-metal element. Optionally, the one or more metal element is selected from one or a combination of zinc, indium, gallium, tin, hafnium, aluminum, titanium, manganese, molybdenum, tungsten, and magnesium.

Optionally, the one or more non-metal element is selected from one or a combination of sulfur, fluorine, chlorine, and carbon.

By doping $M1O_aN_b$ or $M2O_cN_d$ (e.g., zinc oxynitride) with one or more metal element or one or more non-metal element, its ability to prevent metal electrode material diffusion (e.g., copper diffusion), resistance to dry etching, and its wet-etching rate may be further improved. Various metal or non-metal dopants may be screened and selected for improving these characteristics.

Optionally, $M1O_aN_b$ or $M2O_cN_d$ (e.g., zinc oxynitride) is an un-doped $M1O_aN_b$ or $M2O_cN_d$ material.

Optionally, the active layer 6, the source electrode 4, and the drain electrode 5 are patterned in a single patterning process using a half-tone mask. Optionally, each of the diffusion barrier sub-layer and the etch stop sub-layer has a thickness in the range of about 2 nm to about 100 nm (e.g., about 2 nm to about 10 nm, about 10 nm to about 50 nm, about 50 nm to about 75 nm, or about 75 nm to about 100 nm).

FIG. 2 is a diagram illustrating the structure of a bottom gate thin film transistor in some embodiments. Referring to FIG. 2, the thin film transistor in the embodiment includes an active layer 6, and a source electrode 4 and a drain electrode 5 on the active layer 4. Each of the source electrode 4 and the drain electrode 5 may have an electrode structure of FIG. 1. In some embodiments, each of the source electrode 4 and the drain electrode 5 includes a metal electrode sub-layer 1 made of a material including a single metal or a combination of metals (e.g., copper or copper alloy), and a diffusion barrier sub-layer 2 made of a material including $M1O_aN_b$ (e.g., zinc oxynitride) between the metal electrode sub-layer 1 and the active layer 4 for preventing diffusion of metal electrode material. Optionally, the source electrode 4 further includes an etch stop sub-layer 3 made of a material including $M2O_cN_d$ (e.g., zinc oxynitride) on a side of the metal electrode sub-layer 1 distal to the diffusion barrier sub-layer 2. Optionally, the drain electrode 5 further includes an etch stop sub-layer 3' made of a material including $M2O_cN_d$ (e.g., zinc oxynitride) on a side of the metal electrode sub-layer 1' distal to the diffusion barrier sub-layer 2'.

A source electrode 4 and a drain electrode 5 having a metal electrode sub-layer (1 or 1') made of a material including a single metal or a combination of metals (e.g., copper or copper alloy) have low resistivity, leading to a relatively fast and stable transmission rate of display signals. Higher display quality and lower manufacturing costs may be achieved in a display apparatus having such a source electrode 4 and a drain electrode 5, obviating the need for having driving circuits on both sides of the thin film transistor. By having a diffusion barrier sub-layer (2 or 2') made of a material including $M1O_aN_b$ (e.g., zinc oxynitride) between the metal electrode sub-layer (1 or 1') and the active layer 4, diffusion of copper electrode material into the active layer 6 may be prevented. Because a diffusion barrier sub-layer (2 or 2') made of a material including $M1O_aN_b$ (e.g., zinc oxynitride) has a faster etching rate (e.g., wet etching rate) as compared to the copper electrode material, over-etching and damages to the active layer 6 can be avoided during patterning of the source electrode 4 and the drain electrode 5. Moreover, $M2O_cN_d$ (e.g., zinc oxynitride) is resistant to dry etching. By having an etch stop sub-layer (3 or 3') made of a material including $M2O_cN_d$ (e.g., zinc oxynitride) on the source electrode 4 and the drain electrode 5, a single etching process may be used to form (1) a via in an area corresponding to the drain electrode extending through only the passivation layer 10 (stop by the etch stop sub-layer 3 or 3'); and (2) a via in a bonding pad area extending through the passivation layer 10 and the gate insulating layer 9, resulting in a simplified fabricating process and lower manufacturing costs.

The thin film transistor in the embodiment includes a base substrate 7, a gate electrode 8, a gate insulating layer 9, an active layer 6, a source electrode 4, and a drain electrode 5. Optionally, the thin film transistor is a bottom gate thin film transistor. Optionally, the thin film transistor is a top gate thin film transistor.

Figure 3:
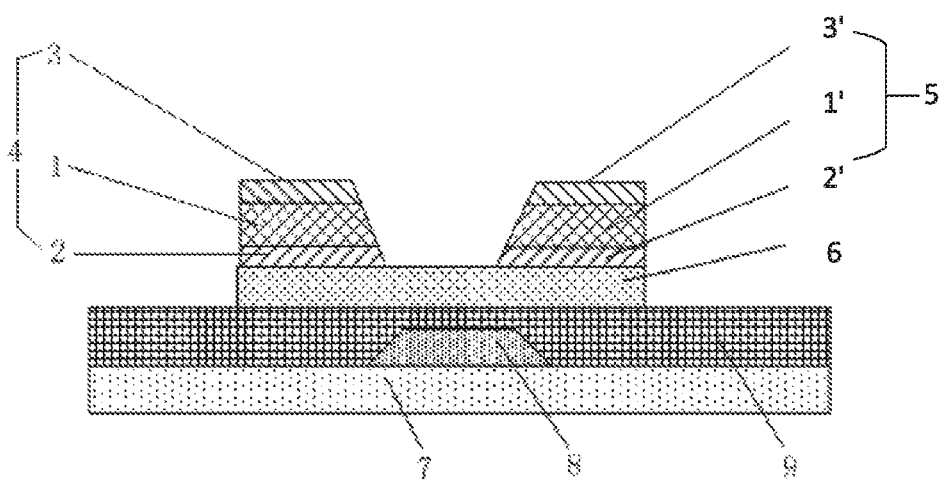
FIG. 3 is a diagram illustrating the structure of a bottom gate thin film transistor in some embodiments.

FIG. 3 is a diagram illustrating the structure of a bottom gate thin film transistor in some embodiments. Referring to FIG. 3, the bottom gate thin film transistor in the embodiment includes a gate electrode 8 on a base substrate 7, a gate insulating layer 9 on a side of the gate electrode 8 distal to the base substrate 7, an active layer 6 on a side of the gate insulating layer 9 distal to the gate electrode 8, a source electrode 4 and a drain electrode 5 on a side of the active layer 6 distal to the gate insulating layer 9, specifically, the diffusion barrier sub-layer (2 or 2') being on a side of the active layer 6 distal to the gate insulating layer 9 and in contact with the active layer 6.

Referring to FIG. 2, the bottom gate thin film transistor in the embodiment further includes a passivation layer 10 on a side of the active layer 6, the source electrode 4, and the drain electrode 5 distal to the gate insulating layer 9.

Figure 4:
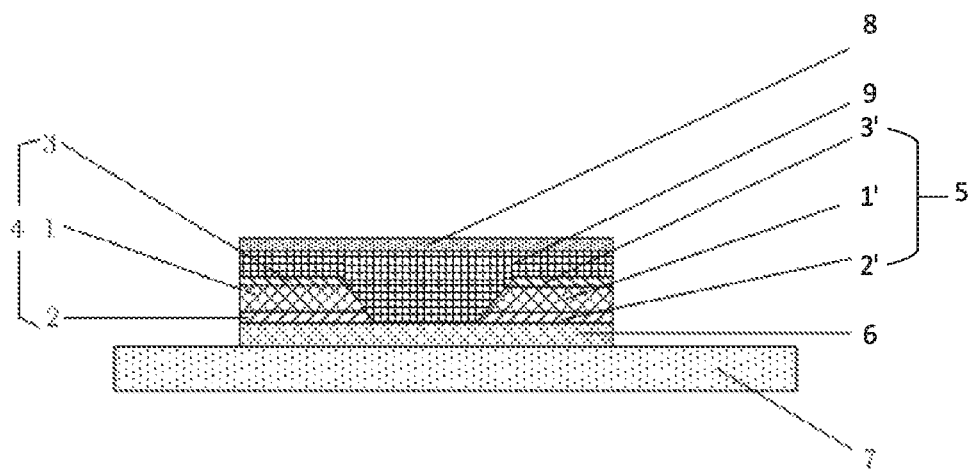
FIG. 4 is a diagram illustrating the structure of a top gate thin film transistor in some embodiments.

FIG. 4 is a diagram illustrating the structure of a top gate thin film transistor in some embodiments. Referring to FIG. 4, the top gate thin film transistor in the embodiment includes an active layer 6 on a base substrate 7, a source electrode 4 and a drain electrode 5 on a side of the active layer 6 distal to the base substrate 7, specifically, the diffusion barrier sub-layer (2 or 2') being on a side of the active layer 6 distal to the base substrate 7. The top gate thin film transistor in the embodiment further includes a gate insulating layer 9 on a side of the source electrode 4 and the drain electrode 5 distal to the active layer 6, and on a side of the active layer 6 distal to the base substrate 7, and a gate electrode 8 on a side of the gate insulating layer 9 distal to the source electrode 4, the drain electrode 5, and the active layer 6.

Figure 5:
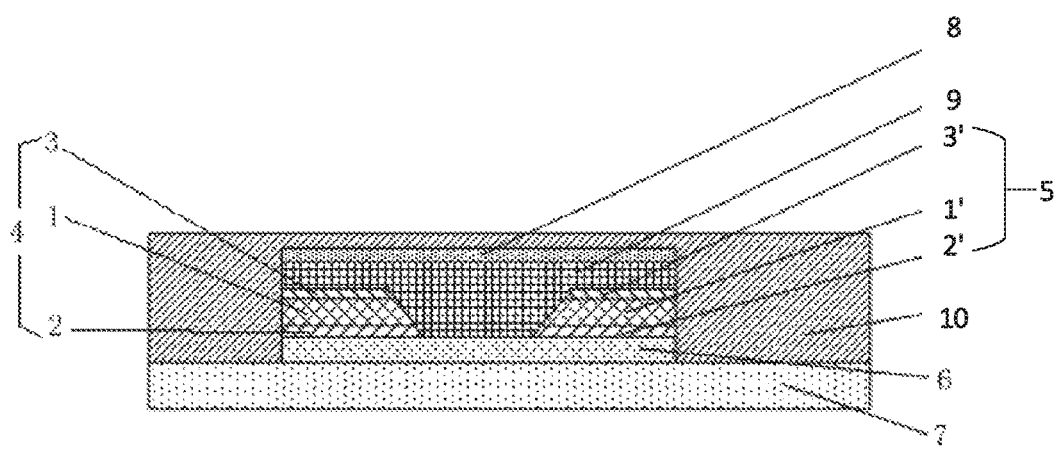
FIG. 5 is a diagram illustrating the structure of a top gate thin film transistor in some embodiments.

FIG. 5 is a diagram illustrating the structure of a top gate thin film transistor in some embodiments. Referring to FIG. 5, the top gate thin film transistor in the embodiment further includes a passivation layer 10 on a side of the gate electrode 8 distal to the gate insulating layer 9.

By having a diffusion barrier sub-layer (2 or 2') made of a material including $M1O_aN_b$ (e.g., zinc oxynitride) between the metal electrode sub-layer (1 or 1') and the active layer 4, diffusion of copper electrode material into the active layer 6 may be prevented. Because a diffusion barrier sub-layer (2 or 2') made of a material including $M1O_aN_b$ (e.g., zinc oxynitride) has a faster etching rate (e.g., wet etching rate) as compared to the metal electrode material (e.g., copper electrode material), over-etching and damages to the active layer 6 can be avoided during patterning of the source electrode 4 and the drain electrode 5. Moreover, $M2O_cN_d$ (e.g., zinc oxynitride) is resistant to dry etching. By having an etch stop sub-layer (3 or 3') made of a material including $M2O_cN_d$ (e.g., zinc oxynitride) on the source electrode 4 and the drain electrode 5, a single etching process may be used to form (1) a via in an area corresponding to the drain electrode extending through only the passivation layer 10 (stop by the etch stop sub-layer 3 or 3'); and (2) a via in a bonding pad area extending through the passivation layer 10 and the gate insulating layer 9, resulting in a simplified fabricating process and lower manufacturing costs.

In some embodiments, the active layer 6 is an oxide active layer. Examples of appropriate oxides for making the active layer 6 include, but are not limited to, indium gallium zinc oxide, hafnium indium zinc oxide, indium zinc oxide, amorphous indium zinc oxide, an amorphous oxide doped with fluorine, indium oxide doped with tin oxide, an amorphous indium oxide doped with molybdenum oxide, chromium tin oxide, an amorphous zinc oxide doped with aluminum oxide, an amorphous titanium oxide doped with niobium oxide.

In another aspect, the present disclosure provides a method of fabricating a thin-film transistor. In some embodiments, the method includes forming an active layer; and forming a source electrode and a drain electrode on the active layer. The step of forming each of the source electrode and the drain electrode includes forming a diffusion barrier sub-layer made of a material including $M1O_aN_b$ (e.g., zinc oxynitride) on the active layer; and forming a metal electrode sub-layer made of a material comprising a single metal or a combination of metals (e.g., copper or copper alloy) on a side of the diffusion barrier sub-layer distal to the active layer. Optionally, the step of forming each of the source electrode and the drain electrode further includes forming an etch stop sub-layer made of a material including $M2O_cN_d$ (e.g., zinc oxynitride) on a side of the metal electrode sub-layer distal to the diffusion barrier sub-layer.

The metal oxynitride or metal nitride sub-layers (e.g., the diffusion barrier sub-layer and the etch stop sub-layer) may be formed by any appropriate method. In some embodiments, metal oxynitride or metal nitride oxynitride sub-layer is formed by a deposition method. Examples of deposition methods include, but are not limited to, sputtering (e.g., magnetron sputtering) and evaporation coating (e.g., a Chemical Vapor Deposition method, a Plasma-Enhanced Chemical Vapor Deposition (PECVD) method, a thermal vapor deposition method).

In some embodiments, the metal oxynitride or metal nitride sub-layer is formed by magnetron sputtering. In a magnetron sputtering process, magnetron sputtering apparatus induces plasma ions of a gas to bombard a target, causing surface atoms of the target material to be ejected and deposited as a film or layer on the surface, of a substrate. For example, metal or metal oxide (e.g., zinc metal or zinc oxide) may be used as the sputtering target, and a plasma including argon, oxygen and nitrogen gases is used to bombard the sputtering target. The ratio among the metal, oxygen, and nitrogen may be controlled by adjusting the contents of oxygen and nitrogen in the plasma. Accordingly, the properties of the metal oxynitride or metal nitride sub-layer can be controlled.

In some embodiments, $M1O_aN_b$ or $M2O_cN_d$ is zinc oxynitride. Zinc oxynitride may be represented by a formula $ZnO_aN_b$, wherein a>0, and b>0. Optionally, zinc oxynitride for making the diffusion barrier sub-layer and the etch stop sub-layer may have different Zn:O:N molar ratios. Optionally, zinc oxynitride for making the diffusion barrier sub-layer and the etch stop sub-layer may have a same Zn:O:N molar ratio. By adjusting the Zn:O:N molar ratio, the etch selectivity between the diffusion barrier sub-layer and the metal electrode sub-layer (e.g., a copper or copper alloy sub-layer) may be adjusted. Optionally, the etch selectivity (e.g., a wet etch selectivity) between the diffusion barrier sub-layer and the metal electrode sub-layer is in the range of about 5:1 to about 100:1.

In some embodiments, $M1O_aN_b$ or $M2O_cN_d$ (e.g., zinc oxynitride) is doped with one or more metal element (e.g., by including the metal element in a bombardment target). For example, one or both of the diffusion barrier sub-layer and the etch stop sub-layer may be made of a material including $M1O_aN_b$ or $M2O_cN_d$ (e.g., zinc oxynitride) doped with one or more metal element. Optionally, the one or more metal element is selected from one or a combination of zinc, indium, gallium, tin, hafnium, aluminum, titanium, manganese, molybdenum, tungsten, and magnesium.

In some embodiments, $M1O_aN_b$ or $M2O_cN_d$ (e.g., zinc oxynitride) is doped with one or more non-metal element (e.g., by including the metal element in a bombardment target or atmosphere). For example, one or both of the diffusion barrier sub-layer and the etch stop sub-layer may be made of a material including $M1O_aN_b$ or $M2O_cN_d$ (e.g., zinc oxynitride) doped with one or more non-metal element. Optionally, the one or more non-metal element is selected from one or a combination of sulfur, fluorine, chlorine, and carbon.

In some embodiments, $M1O_aN_b$ or $M2O_cN_d$ (e.g., zinc oxynitride) is doped with one or more metal element and one or more non-metal element (e.g., by including the metal element in a bombardment target or atmosphere). For example, one or both of the diffusion barrier sub-layer and the etch stop sub-layer may be made of a material including $M1O_aN_b$ or $M2O_cN_d$ (e.g., zinc oxynitride) doped with one or more metal element and one or more non-metal element. Optionally, the one or more metal element is selected from one or a combination of zinc, indium, gallium, tin, hafnium, aluminum, titanium, manganese, molybdenum, tungsten, and magnesium. Optionally, the one or more non-metal element is selected from one or a combination of sulfur, fluorine, chlorine, and carbon.

Optionally, the $M1O_aN_b$ or $M2O_cN_d$ (e.g., zinc oxynitride) is an un-doped $M1O_aN_b$ or $M2O_cN_d$ material (e.g., an un-doped zinc oxynitride material).

In some embodiments, the active layer, the source electrode, and the drain electrode are patterned in a single patterning process using a half-tone mask. The present method simplifies the fabricating process and lowers the manufacturing costs.

In some embodiments, the method includes one or a combination of the following steps: forming a metal electrode material layer; forming an active layer material layer on a gate insulating layer (bottom type thin film transistor) or a base substrate (top type thin film transistor); forming a diffusion barrier material sub-layer on a side of the active layer distal to the gate insulating layer or the base substrate; forming a metal electrode material sub-layer on a side of the diffusion barrier material sub-layer distal to the active layer material layer; forming an etch stop material sub-layer on a side of the metal electrode material sub-layer distal to the diffusion barrier material sub-layer; forming a photoresist layer on a side of the etch stop material sub-layer distal to the metal electrode material sub-layer; exposing the photoresist layer with a mask plate (e.g., a single mask plate); and developing the exposed photoresist layer to obtain a pattern. The pattern includes a first section corresponding to a back channel region of the active layer, the second section corresponding to the source electrode and the drain electrode, and a third section corresponding to the remaining portion of the photoresist layer.

Optionally, the method further includes one or a combination of the following steps: removing the photoresist layer in the third section and partially removing the photoresist layer in the first section; etching the etch stop material sub-layer, the metal electrode material sub-layer, the diffusion barrier material sub-layer, and the active layer material layer in the third section thereby exposing the gate insulating layer (or the base substrate) and forming an active layer; removing the photoresist layer in the first section (e.g., by asking the photoresist layer) thereby exposing the etch stop material sub-layer in the first section; etching the etch stop material sub-layer, the metal electrode material sub-layer, the diffusion barrier material sub-layer in the first section thereby exposing the back channel region of the active layer in the first section; and removing the photoresist layer in the second section.

In some embodiments, the method further includes forming a first via in an area corresponding to the drain electrode extending through only the passivation layer. In some embodiments, the method further includes forming a second via in a bonding pad area extending through the passivation layer 10 and the gate insulating layer 9. Optionally, the first via and the second via may be formed in a single process using a single mask plate. Optionally, the first via and the second via are formed by a dry etching process using a single mask plate. Because the etch stop sub-layer is resistant to dry etching, the etching in the area corresponding to the drain electrode is stopped by the etch stop sub-layer. The bonding pad area does not have an etch stop sub-layer, the dry etching in the bonding pad area removes both the passivation layer and the gate insulating layer. Thus, the first via only extends through the passivation layer whereas the second via extends through both the passivation layer and the gate insulating layer.

In some embodiments, the thin film transistor is a bottom gate thin film transistor. Optionally, the method further includes forming a gate electrode, forming a gate insulating layer on the gate electrode. The active layer is formed on a side of the gate insulating layer distal to the gate electrode, and the diffusion barrier sub-layer is formed on a side of the active layer distal to the gate insulating layer.

In some embodiments, the thin film transistor is a top gate thin film transistor. Optionally, the method further includes forming a gate insulating layer on a side of the etch stop sub-layer distal to the metal electrode sub-layer, and forming a gate electrode on a side of the gate insulating layer distal to the etch stop sub-layer.

In another aspect, the present disclosure provides an array substrate having a thin film transistor described herein or fabricated by a method described herein. In another aspect, the present disclosure further provides a display panel having an array substrate described herein. In another aspect, the present disclosure further provides a display apparatus having a display panel described herein.

The present array substrate, display panel, and display apparatus include a source electrode and a drain electrode described herein. A source electrode and a drain electrode having a metal electrode sub-layer made of a material including copper or copper alloy have low resistivity, leading to a relatively fast and stable transmission rate of display signals. Higher display quality and lower manufacturing costs may be achieved in a display apparatus having such a source electrode and a drain electrode, obviating the need for having driving circuits on both sides of the thin film transistor. By having a diffusion barrier sub-layer made of a material including $M1O_aN_b$ (e.g., zinc oxynitride) between the metal electrode sub-layer and the active layer, diffusion of copper electrode material into the active layer may be prevented. Because a diffusion barrier sub-layer made of a material including $M1O_aN_b$ (e.g., zinc oxynitride) has a faster etching rate (e.g., wet etching rate) as compared to the copper electrode material, over-etching and damages to the active layer can be avoided during patterning of the source electrode and the drain electrode. Moreover, $M2O_cN_d$ (e.g., zinc oxynitride) is resistant to dry etching. By having an etch stop sub-layer made of a material including $M2O_cN_d$ (e.g., zinc oxynitride) on the source electrode and the drain electrode, a single etching process may be used to form (1) a via in an area corresponding to the drain electrode extending through only the passivation layer (stop by the etch stop sub-layer); and (2) a via in a bonding pad area extending through the passivation layer and the gate insulating layer, resulting in a simplified fabricating process and lower manufacturing costs.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising an active layer, and a source electrode and a drain electrode on the active layer;
   wherein each of the source electrode and the drain electrode comprises a combination of a metal electrode sub-layer that is substantially non-transparent, and a diffusion barrier sub-layer between the metal electrode sub-layer and the active layer;
   wherein the diffusion barrier sub-layer is made of a material comprising $M1O_aN_b$ doped with one or more metal element, one or more non-metal element, or a combination thereof, wherein M1 is a single metal or a combination of metals, $a \geq 0$, and $b > 0$.

2. The thin film transistor of claim 1, wherein the metal electrode sub-layer is made of a material comprising copper or copper alloy.

3. The thin film transistor of claim 2, further comprising a gate electrode, a gate insulating layer on the gate electrode, wherein the active layer is on a side of the gate insulating layer distal to the gate electrode, the diffusion barrier sub-layer is on a side of the active layer distal to the gate insulating layer.

4. The thin film transistor of claim 1, wherein each of the source electrode and the drain electrode further comprises an etch stop sub-layer made of a material comprising $M2O_cN_d$, wherein M2 is a single metal or a combination of metals, $c \geq 0$, and $d > 0$ on a side of the metal electrode sub-layer distal to the diffusion barrier sub-layer.

5. The thin film transistor of claim 4, wherein the diffusion barrier sub-layer made of a material comprising zinc oxynitride, and the etch stop sub-layer made of a material comprising zinc oxynitride.

6. The thin film transistor of claim 4, wherein each of the diffusion barrier sub-layer and the etch stop sub-layer has a thickness in a range of about 2 nm to about 100 nm.

7. The thin film transistor of claim 4, further comprising a gate insulating layer on a side of the etch stop sub-layer distal to the metal electrode sub-layer, and a gate electrode on a side of the gate insulating layer distal to the etch stop sub-layer.

8. The thin film transistor of claim 1, wherein a wet etch selectivity between the diffusion barrier sub-layer and the metal electrode sub-layer is in a range of about 5:1 to about 100:1.

9. The thin film transistor of claim 1, wherein the active layer is an oxide active layer.

10. An array substrate comprising the thin film transistor of claim 1.

11. A display apparatus comprising the array substrate of claim 10.

12. A method of fabricating a thin film transistor of claim 1, comprising:
forming an active layer; and forming a source electrode and a drain electrode on the active layer;
wherein forming each of the source electrode and the drain electrode comprises forming a metal electrode sub-layer that is substantially non-transparent and forming a diffusion barrier sub-layer between the metal electrode sub-layer and the active layer
wherein the diffusion barrier sub-layer is made of a material comprising $M1O_aN_b$ doped with one or more metal element, one or more non-metal element, or a combination thereof, wherein M1 is a single metal or a combination of metals, $a \geq 0$, and $b > 0$.

13. The method of claim 12, wherein the metal electrode sub-layer is made of a material comprising copper or copper alloy.

14. The method of claim 12, wherein forming each of the source electrode and the drain electrode further comprises forming an etch stop sub-layer made of a material comprising $M2O_cN_d$, wherein M2 is a single metal or a combination of metals, $c \geq 0$, and $d > 0$ on a side of the metal electrode sub-layer distal to the diffusion barrier sub-layer.

15. The method of claim 14, wherein the diffusion barrier sub-layer made of a material comprising zinc oxynitride doped with one or more metal element, one or more non-metal element, or a combination thereof, and the etch stop sub-layer made of a material comprising zinc oxynitride.

16. The method of claim 12, wherein the active layer, the source electrode, and the drain electrode are patterned in a single patterning process using a single half-tone mask.

17. A thin film transistor, comprising an active layer, and a source electrode and a drain electrode on the active layer;
wherein each of the source electrode and the drain electrode comprises a metal electrode sub-layer, and a diffusion barrier sub-layer made of a material comprising $M1O_aN_b$, wherein M1 is a single metal or a combination of metals, $a \geq 0$, and $b > 0$, between the metal electrode sub-layer and the active layer for preventing diffusion of metal electrode material into the active layer;
each of the source electrode and the drain electrode further comprises an etch stop sub-layer made of a material comprising $M2O_cN_d$, wherein M2 is a single metal or a combination of metals, $c \geq 0$, and $d > 0$ on a side of the metal electrode sub-layer distal to the diffusion barrier sub-layer;
the diffusion barrier sub-layer made of a material comprising zinc oxynitride, and the etch stop sub-layer made of a material comprising zinc oxynitride; and
at least one of the diffusion barrier sub-layer and the etch stop sub-layer is made of a material comprising zinc oxynitride doped with one or more metal element.

18. The thin film transistor of claim 17, wherein the one or more metal element is selected from one or a combination of zinc, indium, gallium, tin, hafnium, aluminum, titanium, manganese, molybdenum, tungsten, and magnesium.

19. A thin film transistor, comprising an active layer, and a source electrode and a drain electrode on the active layer;
wherein each of the source electrode and the drain electrode comprises a metal electrode sub-layer, and a diffusion barrier sub-layer made of a material comprising $M1O_aN_b$, wherein M1 is a single metal or a combination of metals, $a \geq 0$, and $b > 0$, between the metal electrode sub-layer and the active layer for preventing diffusion of metal electrode material into the active layer;
each of the source electrode and the drain electrode further comprises an etch stop sub-layer made of a material comprising $M2O_cN_d$, wherein M2 is a single metal or a combination of metals, $c \geq 0$, and $d > 0$ on a side of the metal electrode sub-layer distal to the diffusion barrier sub-layer;
the diffusion barrier sub-layer made of a material comprising zinc oxynitride, and the etch stop sub-layer made of a material comprising zinc oxynitride;
at least one of the diffusion barrier sub-layer and the etch stop sub-layer is made of a material comprising zinc oxynitride doped with one or more non-metal element.

20. The thin film transistor of claim 19, wherein the one or more non-metal element is selected from one or a combination of sulfur, fluorine, chlorine, and carbon.

* * * * *